United States Patent
Jouvray et al.

(10) Patent No.: US 12,325,912 B2
(45) Date of Patent: Jun. 10, 2025

(54) APPARATUS AND METHOD FOR DEPOSITING CARBON-CONTAINING STRUCTURES

(71) Applicant: AIXTRON SE, Herzogenrath (DE)

(72) Inventors: Alexandre Jouvray, Huntingdon (GB); Bryan Michael Wingfield, Huntingdon (GB); Ashley Thomas Wells, Cambridge (GB); Goncalo Pedro Goncalves, Cambridge (GB)

(73) Assignee: AIXTRON SE, Herzogenrath (DE)

( * ) Notice: Subject to any disclaimer, the term of this patent is extended or adjusted under 35 U.S.C. 154(b) by 0 days.

(21) Appl. No.: 17/773,351

(22) PCT Filed: Oct. 29, 2020

(86) PCT No.: PCT/EP2020/080391
§ 371 (c)(1),
(2) Date: May 31, 2022

(87) PCT Pub. No.: WO2021/084003
PCT Pub. Date: May 6, 2021

(65) Prior Publication Data
US 2024/0150891 A1   May 9, 2024

(30) Foreign Application Priority Data
Oct. 30, 2019   (DE) ............ 10 2019 129 289.1

(51) Int. Cl.
*C23C 16/26*   (2006.01)
*C23C 16/02*   (2006.01)
(Continued)

(52) U.S. Cl.
CPC .......... *C23C 16/26* (2013.01); *C23C 16/0236* (2013.01); *C23C 16/4409* (2013.01); *C23C 16/45557* (2013.01)

(58) Field of Classification Search
CPC . C23C 16/26; C23C 16/0236; C23C 16/4409; C23C 16/45557
(Continued)

(56) References Cited

U.S. PATENT DOCUMENTS

2004/0089237 A1* 5/2004 Pruett .................. C23C 16/26
118/718
2004/0144314 A1* 7/2004 David ................ H01J 37/3277
118/718
(Continued)

FOREIGN PATENT DOCUMENTS

DE   102018110348 A1   10/2019
EP       2450310 A1    5/2012
(Continued)

OTHER PUBLICATIONS

International Search Report mailed Mar. 4, 2022, from ISA/European Patent Office, for International Patent Application No. PCT/EP2020/080391 (filed Oct. 29, 2020), 5 pgs.
(Continued)

Primary Examiner — Brian K Talbot
(74) Attorney, Agent, or Firm — Ascenda Law Group, PC

(57) ABSTRACT

An apparatus deposits carbon-containing structures on a substrate conveyed through an interior space of a housing. The interior space has a central zone between a first peripheral zone and a second peripheral zone. The substrate enters the housing through a first opening of the housing, passes through the first peripheral zone, central zone, and second peripheral zone, and leaves the housing through a second opening of the housing. The second peripheral zone has a gas inlet with a gas outlet opening that feeds a carbon-containing process gas into the housing. The housing has a heating device partially disposed in the central region for thermally activating the process gas. A pump evacuates gas from the interior space through a gas outlet. Means are
(Continued)

provided for the controlled entry of a reactive gas into the first and second peripheral zones.

9 Claims, 2 Drawing Sheets

(51) Int. Cl.
*C23C 16/44* (2006.01)
*C23C 16/455* (2006.01)

(58) Field of Classification Search
USPC .................................................. 427/249.1
See application file for complete search history.

(56) References Cited

U.S. PATENT DOCUMENTS

| | | | | |
|---|---|---|---|---|
| 2010/0272891 | A1* | 10/2010 | Malecki | C23C 16/45519 427/249.1 |
| 2011/0256323 | A1* | 10/2011 | Dickey | C23C 16/403 427/532 |
| 2013/0007156 | A1 | 1/2013 | Roy et al. | |
| 2013/0071565 | A1* | 3/2013 | Malecki | C23C 16/455 118/712 |
| 2014/0329030 | A1* | 11/2014 | Dickey | H01J 37/32027 118/723 R |
| 2016/0068397 | A1* | 3/2016 | Su | C23C 16/452 118/718 |
| 2016/0229758 | A1* | 8/2016 | Kmetz | C04B 35/62844 |
| 2016/0273100 | A1* | 9/2016 | Shibuya | C23C 16/4405 |
| 2016/0289826 | A1* | 10/2016 | Boulanger | B01J 19/1862 |
| 2021/0172059 | A1* | 6/2021 | Yoon | C23C 16/50 |
| 2021/0189565 | A1* | 6/2021 | Jouvray | C23C 16/4409 |
| 2023/0212746 | A1* | 7/2023 | Bedoya | C23C 16/45551 427/535 |

FOREIGN PATENT DOCUMENTS

| | | |
|---|---|---|
| EP | 3015425 A1 | 5/2016 |
| KR | 101760653 B1 | 7/2017 |
| WO | 2013/043247 A1 | 3/2013 |

OTHER PUBLICATIONS

Written Opinion mailed Mar. 4, 2022, from ISA/European Patent Office, for International Patent Application No. PCT/EP2020/080391 (filed Oct. 29, 2020), 7 pgs.

International Preliminary Report on Patentability issued May 3, 2022, from The International Bureau of WIPO, for International Patent Application No. PCT/EP2020/080391 (filed Oct. 29, 2020), 15 pgs.

Written Opinion mailed Mar. 4, 2022, from ISA/European Patent Office, for International Patent Application No. PCT/EP2020/080391 (filed Oct. 29, 2020), English translation, 6 pgs.

* cited by examiner

APPARATUS AND METHOD FOR DEPOSITING CARBON-CONTAINING STRUCTURES

RELATED APPLICATIONS

This application is a National Stage under 35 USC 371 of and claims priority to International Application No. PCT/EP2020/080391, filed 29 Oct. 2020, which claims the priority benefit of DE Application No. 10 2019 129 289.1, filed 30 Oct. 2019.

FIELD OF THE INVENTION

The invention relates to an apparatus for depositing carbon-containing structures on an endless substrate conveyed through a housing, wherein the housing has a central zone arranged between a first peripheral zone and a second peripheral zone, wherein the substrate enters the housing a through a first opening assigned to the first peripheral zone, passes through the central zone in a conveying direction and exits the housing through a second opening assigned to the second peripheral zone, with a gas inlet for feeding a carbon-containing process gas into the housing, with a heating device for thermal activation of the process gas, with a gas outlet that is connectable to a gas removal system, for example to a pump, for leading out the gas that is fed into the housing.

The invention further relates to a method for depositing carbon-containing structures on an endless substrate conveyed through a housing, wherein the substrate enters a housing a through a first opening assigned to a first peripheral zone, passes through a central zone of the housing in a conveying direction and exits the housing through a second opening assigned to a second peripheral zone of the housing, wherein a carbon-containing process gas is fed into the housing through a gas inlet, which process gas is thermally activated by a heating device, wherein the gas fed into the housing is removed from the housing through a gas outlet by means of a gas removal system, for example a pump.

BACKGROUND

Apparatuses for depositing carbon-containing structures, for example nanotubes, graphene or the like, are known from EP 3 015 425 A1, EP 2 450 310 A1 and WO 2013/043247 A1.

DE 10 2018 110 348 and KR 101760653 describe an apparatus and a method for depositing carbon nanostructures.

A CVD reactor with multiple growth zones for coating an endless substrate is described in US 2013/0071565.

The apparatus has a housing which has openings on two opposite sides of the housing. Through a first opening, an endless substrate that is to be coated with the carbon structures enters a housing cavity in which a process chamber is located. The endless substrate leaves the housing again on the opposite side. It is unwound from a first roll and wound up on a second roll. Inside the housing, a carbon-containing process gas is heated to such a process temperature that a chemical reaction of the process gas forms the carbon-containing structures on the endless substrate, which passes through the process chamber in a conveying direction.

The regions in which the substrate enters the housing and in which the substrate leaves the housing include a diffusion barrier. The diffusion barrier has a flushing chamber, into which an inert gas is fed. For this purpose, multiple gas outlet openings and gas inlet openings arranged on both sides of the substrate are provided, through which a flushing gas can enter the flushing chamber and exit the chamber again. In this way, the entry of ambient air into the interior of the housing is suppressed.

The substrate that is coated with the carbon structures in a central zone of the housing must have a clean surface.

SUMMARY OF THE INVENTION

The object underlying the invention is to describe measures by which a generic apparatus or a generic method can be refined in such a way that the coating result is improved.

This object is achieved by the invention described in the claims, wherein the dependent claims not only represent advantageous further developments of the invention as set forth in the independent claims, but also represent stand-alone solutions.

The invention relates to an apparatus and a method for depositing carbon-containing structures, wherein the carbon-containing structures are in particular graphene layers or carbon nanotubes, but are not limited thereto. The apparatus has a housing or a chamber in which a gas pressure is adjustable, which lies in the range between 950 mbar and 1,500 mbar, for example.

First and foremost, it is suggested that means are provided in one of the two peripheral zones into which the substrate enters and from which it exits, by which means a reactive gas is fed into the peripheral zone. The reactive gas may be an oxidizing gas, which preferably enters the housing through the first opening. The entry of the reactive gas thus takes place in the conveying direction, so that the not yet coated substrate comes into contact with the reactive gas in the first peripheral zone. Inside the process chamber formed by the central zone, the temperature of the substrate and/or reactive gas is controlled in such manner that a chemical reaction takes place. In an inlet zone of the substrate formed by the peripheral zone on the substrate inlet side, the temperature of the reactive gas and/or the temperature of the substrate rises to a point that the reactive gas can perform a cleaning function. Means may be provided with which a concentration gradient of the reactive gas in the flow direction is set by extracting the gas from the housing or by feeding an inert gas into the housing. When the substrate passes into the housing, the reactive gas may have a high partial pressure within the gas phase of the housing. This partial pressure falls with increasing distance from the inlet opening through which the substrate enters the housing.

The reactive gas may react chemically with the surface of the substrate or with substances adhering to the surface of the substrate. The chemical reaction may produce volatile reaction products, which are removed from the housing interior by means of a gas removal system including, for example, a pump and a gas outlet. A feed line may be provided, through which the reactive gas, which may be oxygen or also dry air, is fed into the housing interior. The inlet opening or the outlet opening, through which the substrate enters the housing interior, may be closable openings or locks. In particular, it is provided that the substrate is an endless substrate.

The first and second openings may each be or form diffusion barriers which are flushed by an inert gas, for example nitrogen. A diffusion barrier of such kind has a multiplicity of gas outlet openings arranged in even distribution on a gas outlet array, through which an inert gas exits towards each of the two opposite broadsides of the substrate.

The gas outlet openings may be arranged adjacent to gas inlet openings, and the inert gas, which is introduced into a flushing chamber in such manner that it flows through the substrate, is sucked out again through the gas inlet openings.

But it is also possible to operate the diffusion barrier only with gas outlet openings, wherein it is then preferably provided that an negative pressure exists inside the housing interior, so that inert gas fed into a gap between substrate surface and gas outlet openings flows entirely, or almost entirely, into the housing interior. The inert gas may then convey ambient air together with the oxygen contained therein into the housing interior.

The gas stream created thereby may be directed in the conveying direction or against the conveying direction of the substrate. In a preferred embodiment of the invention, the first opening is positioned vertically above the second opening, so that the substrate moves through the process chamber from the top to the bottom. The reactive gas is preferably only fed in through the upper or inlet-side opening. The process gas may be hydrogen, methane, acetylene, ethylene or another carbon-containing gas or a combination of said gases either in pure form or mixed in with an inert gas.

The process gas may be a mixture of these gases, wherein hydrogen may preferably be contained additionally. The ratio of a carbon-containing gas to hydrogen or to an inert gas such as nitrogen in the process gas may be in the range 0.25 and 2 or in a range between 0.5 and 2 or equal to 1. In the last case, no hydrogen or no inert gas is fed into the housing interior.

The inert gas may be nitrogen, argon or another non-reactive gas. The reactive gas that is able to perform the cleaning function on the substrate is preferably oxygen. In a preferred embodiment of the invention, the diffusion barriers are designed such that atmospheric oxygen passes through the diffusion barriers. In a preferred embodiment, the diffusion barrier assigned to the first opening is controlled by a control device in such manner that a controlled proportion of oxygen enters the peripheral zone through the diffusion barrier. In contrast, the diffusion barrier assigned to the second opening is controlled by the control device in such manner that little or no oxygen can enter the peripheral zone that is assigned to the second opening through the diffusion barrier.

The diffusion barrier may be controlled on the one hand by variations of the mass flow of the inert gas. On the other hand, however, it may also be controlled through a variation of the height of the gap between the gas outlet openings, or a variation of the height of the gap between the gas inlet openings if present, wherein the gas inlet openings or gas outlet openings are arranged in inlet arrays or gas outlet arrays that extend parallel to the substrate surface. Control can be effected through variations of the distance from the gas inlet arrays or gas outlet arrays to the substrate surface.

In particular, it is provided that both diffusion barriers are controlled in such manner that the partial pressure of the oxygen directly on the first edge of the peripheral zone adjacent to the first opening has a value of at least 0.1% (1,000 ppm), and that the partial pressure of the oxygen directly on the second edge of the peripheral zone adjacent to the second opening has a value of less than 0.01% (100 ppm), wherein the partial pressure at the beginning of the central zone is preferably not greater than 0.005% (50 ppm) or than 0.001% (10 ppm). It may be provided that the two partial pressures directly on the edge of the respective peripheral zones differ from each other by a factor of at least 5, a factor of 10, or by a factor of at least 100. With the means arranged inside the housing for influencing the partial pressure of the reactive gas, a concentration gradient is preferably created that decreases by a factor of at least 10, 20, 50, 100, 200, 500 or 1,000 from the periphery to the middle of the process chamber.

The diffusion barrier assigned to the first opening and the diffusion barrier assigned to the second opening are not completely gastight, with the result that a gas stream of the ambient atmosphere is able to get into the housing interior through both diffusion barriers. In order to ensure that the partial pressure of the reactive gas is lower in the second peripheral zone than in the first peripheral zone, the two diffusion barriers may be designed differently, for example the gap through which the substrate passes through the flushing chamber of the diffusion barriers may have a different gap width or height or cross-sectional area. Alternatively or interactively therewith, the mass flow of the flushing gas may also be controlled differently by the control device in such manner that a greater mass flow of the reactive gas enters the housing interior through the first opening than through the second opening. Alternatively or interactively therewith, the mass flow of the flushing gas may also be controlled differently by the control device in such manner that a greater mass flow of the reactive gas enters the housing interior through the first opening than through the second opening. But alternatively or in combination therewith, it is also provided that a gas is fed in close to the second opening, in particular in the second peripheral zone, and reacts chemically with the reactive gas, wherein an inert gas is obtained as a reaction product. It is provided in particular that a gas outlet opening is arranged in the second peripheral region for the process gas, which preferably reacts chemically with the reactive gas. In order to create a concentration gradient of the reactive gas that decreases in the conveying direction in the region of the first opening or the first peripheral zone, one or more gas outlet openings are provided there, with which gas can be pumped out of the housing interior.

The reactive gas reacts not only with the contaminants on the substrate surface, but also with the process gas. It may be provided that the process gas is fed into the process chamber formed by the housing interior at a feed point which is remote from the feed point of the reactive gas. The feed point of the process gas is preferably located in the second peripheral zone. There, it is preferably at a distance from the second opening such that the distance between the gas outlet opening from the gas inlet for feeding in the process gas is at a distance about 5-10% of the overall length of the process chamber from the second opening, wherein the overall length is the distance between first opening and second opening. The length of the first peripheral zone measured in the conveying direction may be in the range between 20 and 30%, preferably equal to 25% of the overall length. The length of the second peripheral zone may be in the range between 15 and 25% of the overall length. It is preferably equal to 20% of the overall length. The process gas flows through the process chamber in the opposite direction to the conveying direction of the substrate and reacts chemically with the reactive gas preferably only in the region of the first peripheral zone. This leads to a reduction of both the partial pressure of the reactive gas and the partial pressure of the process gas in the first peripheral zone, but prevents the reactive gas from getting into the central zone. Accordingly, the first peripheral zone is a cleansing zone, in which a chemical reaction takes place between reactive gas and a carbon-containing gas of the process gas. The central zone is a growth zone, in which the carbon structures are deposited without allowing said structures to be burned by the reactive gas. The temperature inside the growth zone is preferably in a range between 500° C. and 1,200° C., preferably between 600° C. and 900° C., when graphene multilayer structures are deposited. On the other hand, if graphene monolayers are to be deposited, the temperature may be in the range between 500° C. and 1,200° C., and in particular in a range between 850° C. and 1,100° C. Otherwise, if carbon nanotubes (CNT) are to be deposited, the temperature may be in the range between 500° C. and 1,000° C., preferably in a range between 600° C. and 700° C. In this case, the temperature is preferably in a range between 600° C. and 660° C. or in a range between 615° C. and 625° C. respectively. The temperature of the substrate in the first peripheral zone may be in the range between 500° C. and the substrate temperature in the central zone.

A cooling device may be provided, with which the substrate may be cooled before exiting the housing interior. The cooling device is preferably formed by the diffusion barrier assigned to the second opening. With the diffusion barrier, heat can be dissipated from the substrate leaving the housing interior. This preferably takes place due to the inert gas which is fed into the diffusion barrier. The temperature of said inert gas is controlled to below a predetermined temperature, of 50° F. for example. By feeding the inert gas into the gap between gas outlet openings and the substrate, the substrate is cooled to temperatures below 150° C. or below 100° C. This prevents carbon structures that are deposited on the substrate from being burned up in the ambient air. It is further provided that the diffusion barrier of the second opening is operated in such manner that as little ambient air as possible gets into the housing interior.

BRIEF DESCRIPTION OF THE DRAWINGS

In the following text, the invention will be explained in greater detail with reference to exemplary embodiments. In the drawings.

DETAILED DESCRIPTION

Figure 1:
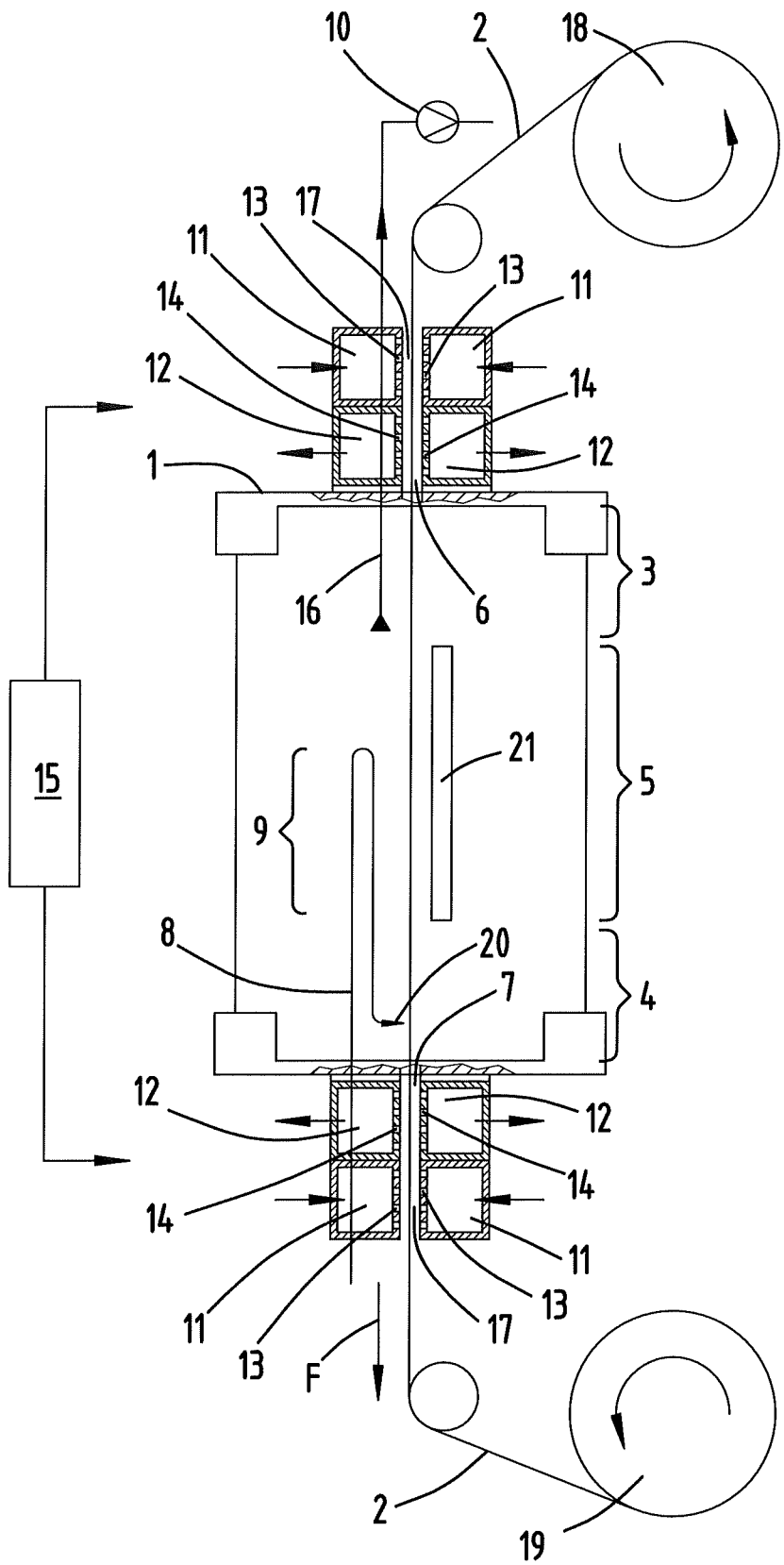
FIG. 1 is a schematic representation of a cross section through a first embodiment of an apparatus according to the invention.

The apparatus represented in the drawings has an elongated housing 1, with a housing casing, which is closed at its underside and at its upper side opposite thereto with an end cap. The two end caps each have an opening 6, 7, which have a narrow form through which a substrate 2 can pass into the interior of the housing 1 and pass out of the housing 1 again. The substrate 2 is an endless substrate which can be drawn off from a first roll 18 and wound onto a second roll 19 again.

The upper, first opening 6 forms an inlet opening for the substrate 2, the lower opening 7 forms an outlet opening for the substrate 2. The substrate 2 passes through the apparatus in a straight, vertically downwardly directed conveying direction F. Inside the apparatus there is a gas inlet 8, through which a process gas, for example methane, acetylene or ethylene is fed into the process chamber. A heating device 9 is provided, with which the process gas is heated. A further heater 21 may be provided, with which the substrate 2 is heated.

The interior of the housing 1 forms three zones arranged one after the other in conveying direction F. A first peripheral zone 3 immediately adjoins the first opening 6. A second peripheral zone 4 immediately adjoins the second opening 7. Between these, a central zone 5 extends, in which a coating process takes place. In the coating process, carbon structures are deposited on one of the two broad sides of the substrate 2 through a chemical reaction of the process gas. The carbon structures may be carbon nanotubes or graphene.

A gas outlet 16 is provided, with which gas may be transported out of the volume of the housing 1. The gas outlet 16 is connected to a pump 10.

A diffusion barrier is provided before the first opening 6 in conveying direction F and after the second opening 7 in the conveying direction, with which the entry of ambient air may be prevented or controlled. With a control device 15, the diffusion barrier on the substrate inlet side is controlled in such manner that a constant stream of ambient air, that is to say an oxygen-containing gas stream, enters the first peripheral zone 3 through the first opening 6. On the other hand, the diffusion barrier on the substrate outlet side is controlled by the control device in such manner that no or only a small fraction of ambient air, that is to say of oxygen contained in the ambient air, is able to enter the second peripheral zone 4 through said diffusion barrier.

The substantially identically designed diffusion barriers each form a flushing chamber 17, through which the substrate 2 is conveyed. The flushing chamber 17 thus has two sections, which are each assigned to one of the two broadsides of the substrate 2. A gas inlet arrangement with a gas distribution volume 11 and a gas outlet arrangement with a gas extraction volume 12 is assigned to each of the two sections of the flushing chamber 17. An inert gas, for example nitrogen, is fed into the gas distribution volume 11, entering through gas outlet openings 13 in the respective section of the flushing chamber 17. The inert gas is deflected on the broadside surface of the substrate 2 and flows in the conveying direction or in the opposite direction to the conveying direction to gas inlet openings 14, which are connected to the gas extraction volume 12, which gas outlet volume is sucked out so that a gas stream is formed in the flushing chamber 17. This gas stream forms a diffusion barrier, in which the ambient air entering the flushing chamber is extracted through the gas inlet openings 14.

The barrier function of the flushing chamber 17 may be varied via its width. The greater the distance between two oppositely located gas outlet arrays or gas inlet arrays, the weaker the barrier function. The barrier function can be influenced not only through the width or height or cross-section area of the flushing chamber 17, but also through the volume flow of the inert gas. The control device 15 is programmed in such a way that the barrier functions of the two diffusion barriers differ from each other. The barrier function of the diffusion barrier on the substrate inlet side is adjusted so that oxygen-containing air passes through the flushing chamber 17 with such a volume flow that a partial pressure not exceeding 1%, preferably not exceeding 0.2% oxygen is created immediately adjacent to the opening 6 within the peripheral zone 3.

On the other hand, the barrier function of the diffusion barrier on the substrate outlet side is adjusted such that oxygen-containing air passes through the flushing chamber 17 with such a volume flow that a lower partial pressure, in particular less than 0.1% or less than 0.02% is created immediately adjacent to the opening 7 within the peripheral zone 4.

Figure 2:
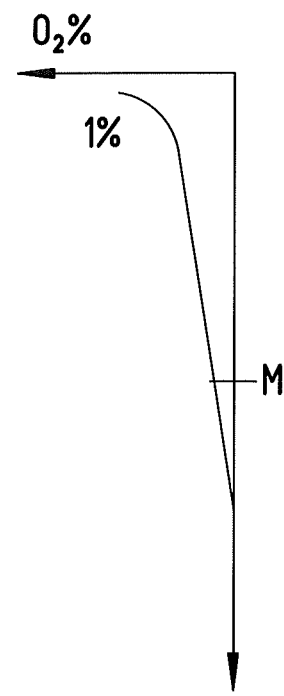
FIG. 2 shows the partial pressure development of the reactive gas in the conveying direction of the substrate.

The gas outlet 16 is designed such that a concentration gradient of the reactive gas is produced in the conveying direction. The partial pressure of the oxygen inside the process chamber decreases constantly in conveying direction F, as is shown in FIG. 2.

For this purpose, the gas outlet 16 may include a plurality of gas outlet openings arranged in the conveying direction, which form extraction openings.

The gas inlet 8 may have a gas outlet opening which is arranged on the substrate outlet side in the peripheral zone 4. The process gas flows through this in the opposite direction to the conveying direction F out of the peripheral zone 4 into the central zone 5. The heating device 9 causes the process gas to be heated up. In this context, the process gas may undergo thermal decomposition while still inside the gas supply line. The pipeline of the gas inlet may thus form a loop which extends through the heated central region 5. A heater 21 is provided for heating the central region 5.

The process gas may also contain hydrogen or another reducing gas besides the carbon-containing gas.

The process gas reacts with oxygen. In particular, it is provided that, by preheating, the process gas and/or the substrate 2 is heated to a temperature at which it reacts chemically with oxygen. In this respect, it is advantageous if the process gas or a part of the process gas is fed into the second peripheral zone 4 immediately adjacent to the second opening 7, in order to react there with oxygen that is diffusing in through the diffusion barrier. This produces a significant additional reduction of the oxygen partial pressure in that region.

The apparatus according to the invention thus has two inlet openings 6, 7, wherein the second inlet opening 7 is a passive inlet opening, through which as little oxygen as possible is able to enter the housing interior. On the other hand, the first opening is an active opening, through which a controlled oxygen flow is able to enter the housing interior. The substrate passes into the housing interior through the active opening and out of the housing interior through the passive opening. Immediately after the opening 6, the partial pressure of the oxygen entering the housing interior is in a range between 0 and 1% of the total pressure. The total pressure may be the atmospheric pressure. The oxygen flow through the opening 6 may be controlled by adjustment of the inert gas flow of the diffusion barrier. In this way, the substrate 2 formed by a film may be cleaned as it enters the housing interior. A separate oxygen source may be provided, for example through an oxygen supply line 22, with which oxygen is fed into the first peripheral zone 3 in a targeted manner. For this purpose, a separate gas inlet, a showerhead, for example, may be provided there.

The gas outlet opening 20, with which a reducing gas is fed into the second peripheral zone 4, may be a second gas outlet opening of a gas inlet device, with which the process gas is fed into the central zone 5. A further gas inlet, not shown in FIG. 1, is thus provided, with which the process gas is fed directly into the central zone.

The temperature in the region of the central zone is higher than in the region of the peripheral zones 3, 4. It is therefore advantageous if a pipeline of the gas inlet 8 passes through the central zone 5 and a preheated process gas exits through the gas outlet opening 20. The preheated process gas may react in the region of the second peripheral zone 4 with the atmospheric oxygen entering through the diffusion barrier there to yield $CO_2$ for example.

To a certain degree, the two diffusion barriers in front of the openings 6, 7 of the housing caps create seals of gas curtains, which are controlled in such manner that a controlled flow of oxygen enters the process chamber through the seal on the substrate inlet side, wherein the concentration gradient in the process chamber decreases to a predetermined value as far as about the middle of the process chamber, while as little oxygen as possible enters the process chamber through the seal on the substrate outlet side, wherein a chemical reaction is also to take place there, involving the oxygen that enters the process chamber.

The carbon-containing process gas may be fed in through an inlet element in the form of a "showerhead" which is arranged in the central zone 5.

According to one variant, the gas outlet with which gas-phase reaction products of the reactive gas and the process gas are removed from the process chamber and the adjacent peripheral zones from the housing interior may be designed in such manner that a concentration gradient of the reactive gas is set such that the concentration has a high value of maximally 20 ppm for example directly at the inlet opening 6, consists of a lower value of maximally 5 ppm or 1 ppm at the boundary with the central zone 5, and is close to 0 in the middle M of the process chamber. The total pressure in the housing interior may have a value 15 mbar to 50 mbar below the external pressure.

The invention relates in particular to an apparatus and a method in which oxygen is fed in a targeted manner into an input zone and in an output zone a gas reacting with oxygen is introduced in targeted manner, and in which a gradient of the concentration of the reactive gas which decreases in the conveying direction is produced in the housing interior by means of a gas outlet device arranged close to the entry zone.

Figure 3:
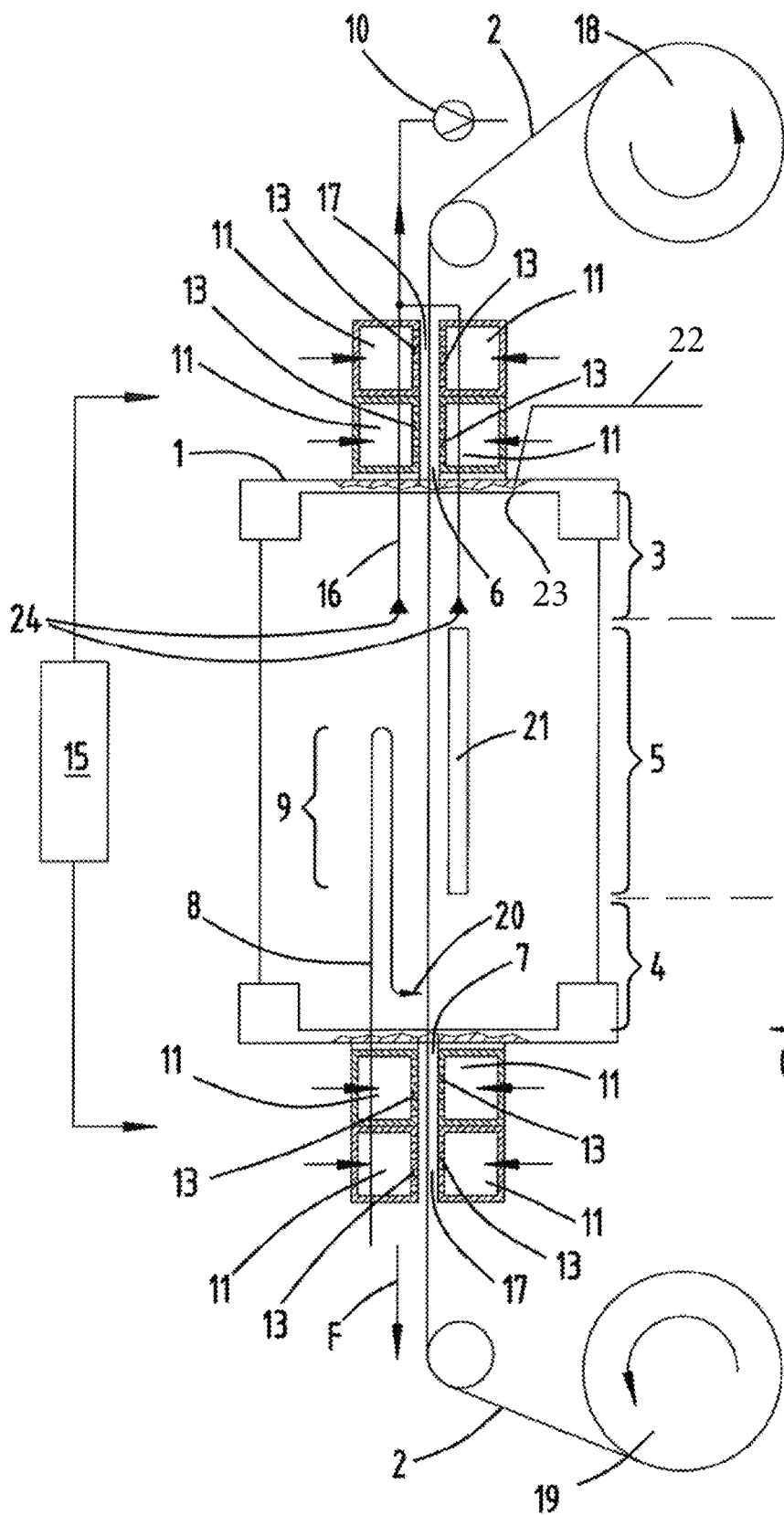
FIG. 3 is a representation of a second embodiment in the same manner as FIG. 1.

The embodiment shown in FIG. 3 is substantially the same as the embodiment represented in FIGS. 1 and 2, so reference is made to the notes pertaining thereto.

A diffusion barrier arranged outside of the housing 1 is adjacent to the first opening 6. Out of two distribution volumes 11, which are each positioned opposite one of the two broadside surfaces of the substrate 2, an inert gas passes through gas outlet openings 13 into a gap between the two gas outlet arrays that hold the gas outlet openings 13. The substrate 2 is transported through this gap, which forms a flushing chamber 17, and is then brought through the opening 6 into a housing 1 that forms a process chamber. Ambient air flows into the process chamber through the gap that forms the flushing chamber 17. According to one variant, the diffusion barrier is configured and controlled in such manner that the partial pressure of the oxygen contained in the ambient air has a value not exceeding 1000 ppm in the region of the first opening 6.

An extraction opening 24, through which gas can be sucked out of the process chamber by means of a pump 10, is located preferably beside both broadsides of the substrate 2 in the region of the boundary between the first peripheral zone 3 and the central zone 5.

A diffusion barrier is also arranged adjacent to the second opening 7. It is constructed in the same way as the diffusion barrier of the first opening 6 described above, but it is configured and operated in such manner that as little ambient air as possible is able to get into the process chamber through the diffusion barrier.

Through the first opening 6 and through the second opening 7, atmospheric oxygen enters the process chamber, where it reacts with the process gas which is fed into the process chamber through the gas outlet opening 20, and in particular with the carbon-containing gas and/or the hydrogen-containing gas contained therein. The chamber in which the chemical reaction takes place adjacent to the second opening 7 is limited to the immediate vicinity of the second opening 7. In this context, steps are taken that are designed to prevent carbon structures deposited on the substrate from being burned by atmospheric oxygen.

Figure 4:
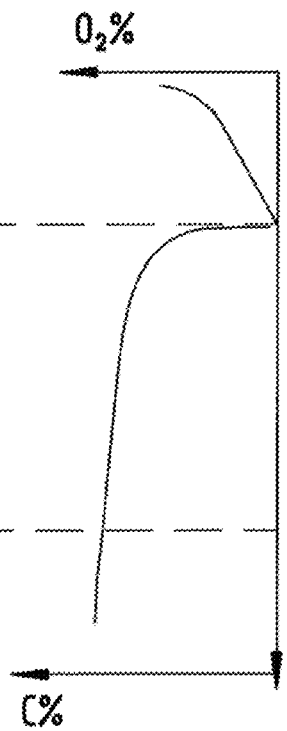
FIG. 4 is a representation of a second embodiment in the same manner as FIG. 2.

FIG. 4 reveals that the partial pressure of the oxygen fed in through the first opening 6 decreases continuously. This takes place on the one hand because of a reaction of the atmospheric oxygen with contaminants on the substrate 2, on the other hand due to extraction of the gas through the gas outlet 16, and also because of a chemical reaction between the atmospheric oxygen in the region of the first peripheral zone 3 with the process gas. In this context, steps are taken that are designed to prevent atmospheric oxygen from getting into the central zone 5. The partial pressure of the process gases and in particular of the carbon-containing gas contained in the process gas is substantially constant over the entire length of the central zone 5, and decreases in the region of the end of the central zone 5 that adjoins the first peripheral zone 3.

According to the invention, the diffusion barrier adjacent to the second opening 7 is operated as a cooling device, in order to cool the substrate 2 exiting the process chamber to temperatures below 150° C. For this purpose, heat is extracted from the substrate 2 by the inert gas which is fed into the flushing chamber 17.

The preceding description serves to explain the inventions that fall within the overall scope of the application, which also each independently advance the related art at least through the following feature combinations, wherein two, several or all of said feature combinations may also be combined, namely:

An apparatus which is characterized in that means are provided for the controlled entry of a reactive gas into the first peripheral zone 3.

A method, characterized in that a reactive gas enters the first peripheral zone 3 in controlled manner, which gas reacts chemically with contaminants of the substrate in the first peripheral zone.

An apparatus which is characterized in that means are provided with which a mass flow of a reactive gas may be fed both into the first peripheral zone 3 and into the second peripheral zone 4 in controlled manner, wherein the mass flow entering into the first peripheral zone 3 is greater than the mass flow entering into the second peripheral zone 4.

An apparatus or a method, characterized in that the first opening 6 and the second opening 7 are each formed by a diffusion barrier 11, 12, 13, 14 flushed with an inert gas, through which the substrate 2 is conveyed, wherein the diffusion barriers 11, 12, 13 are constructed in such manner or the inert gases that flush them are mass-flow controlled in such manner that the mass flow entering through the first opening 6 is adjustable or is adjusted by ambient air containing oxygen as reactive gas or is controllable or is controlled by a control device.

An apparatus or a method, characterized in that the diffusion barriers 11, 12, 13, 14 are controllable or are controlled by altering the inert gas flow and/or by a distance from gas outlet openings 13 or gas inlet openings 14.

An apparatus or a method, characterized in that through a reactive gas inlet opening 23, by which the reactive gas in can be fed or is fed into at least the first peripheral zone 3.

An apparatus or a method, characterized in that the gas outlet opening 20 and/the extraction opening 24 are arranged or are operated in the housing interior in such manner that a partial pressure of the reactive gas decreases constantly in conveying direction F from the first opening 6, so that the chemical reactions of the reactive gas with contaminants on the substrate 2 and a chemical reaction with the process gas take place only or at least at a rate of 90% in the first peripheral zone 3.

An apparatus or a method, characterized in that the diffusion barrier 11, 12, 13, 14 has outlet openings 13 which generate a gas stream directed into a flushing chamber 17 transversely to the conveying direction F, which stream exits or is extracted from the flushing chamber 17 through gas inlet openings 14 or flows into the housing interior.

An apparatus or a method, characterized in that the gas outlet opening 20 in the second peripheral zone 3 is arranged or is operated in such manner that a partial pressure of the process gas falls in a direction opposite to the conveying direction F.

An apparatus or a method, characterized in that the gas inlet 8 or a pipeline of the gas inlet 8 is preheatable or is preheated with a second heating device 9.

An apparatus or a method, characterized in that the second heating device 9 is arranged at least partly in the central region 5.

An apparatus or a method, characterized in that the extraction opening 24 is arranged or is operated at the boundary between first peripheral zone 3 and central zone 5 in the housing interior in such manner that in the first peripheral zone 3 the reactive gas reacts chemically with contaminants on the surface of the substrate 2 to clean the substrate 2, and in the central zone 5 the carbon-containing structures are deposited.

An apparatus or a method, characterized in that a cooling device is provided, with which the substrate 2 exiting from the second opening 7 may be or is cooled.

An apparatus or a method, characterized in that the diffusion barrier (11, 12, 13, 14) is designed or is operated as a cooling device, with which the substrate (2) is cooled.

An apparatus or a method, characterized in that the diffusion barriers 11, 13 have gas outlet openings 13 directed towards the surface of the substrate 2, through which an inert gas is fed into a gap between the gas outlet openings 13 and the substrate 2, wherein the total pressure in the housing interior is adjusted in such manner that the inert gas fed into the gap flows into the gas interior.

An apparatus or a method, characterized in that the substrate 2 is an endless substrate which may be or is unwound from a first roll 18, that after the cleaning of the surface of the substrate inside the housing interior and coating of the surface of the substrate 2 in said housing interior may be or is wound onto a second roll 19.

An apparatus which is characterized in that for an overall length between the first opening 6 and the second opening 7 defined by the distance measured in conveying direction F, the length of the first peripheral zone 3 is equal to 20-30% or 25% of the overall length, and/or the length of the second peripheral zone 4 is equal to 15-25% or 20% of the overall length.

An apparatus which is characterized in that the gas outlet opening 20 in the direction opposite to the conveying direction F is located at a distance from the second opening 7, or that the measured distance in conveying direction F between the gas outlet opening 20 and the second opening 7 corresponds to 5-10% of the overall length.

A method, characterized in that the total pressure inside the housing interior is at least 50 mbar lower than the ambient pressure.

A method, characterized in that in the central zone 5 the substrate 2 is heated to a temperature in the range between 500° C. and 1,200° C. or in the range between 600° C. and 900° C. for depositing graphene multilayer structures, or is heated to a temperature in the range between 500° C. and 1,200° C. or in the range between 850° C. and 1,100° C. for depositing graphene monolayers, or is heated to a temperature in the range between 500° C. and 1,000° C. or in the range between 600° C. and 700° C. for depositing carbon nanotubes (CNT).

A method, characterized in that the partial pressure of the reactive gas in the region of the first opening 6 is equal to not more than 0.1% (1,000 ppm) of the total pressure in the housing interior and/or that the partial pressure of the reactive gas at the boundary between first peripheral zone 3 and central zone 5 is lower than 0.005% (50 ppm) or than 0.001% (10 ppm) of the total pressure.

A method, characterized in that the substrate temperature in the first peripheral zone 3 is raised to a temperature of more than 500° C.

A method, characterized in that the process gas contains at least one of the following gases: $CH_4$, $C_2H_2$, $C_2H_4$, $N_2$ and/or is a mixture of at least two of these gases.

A method, characterized in that the mass ratio of a carbon-containing gas to hydrogen or an inert gas in the process gas is in the range between 0.25 and 2 or in the range between 0.5 and 2 or is equal to 1.

A method, characterized in that neither a direct gas feed nor a direct gas extraction is carried out in the central zone 5.

A method, characterized in that upon exiting the housing interior through the second opening 7 in the diffusion barrier 11, 12, 13, 14 the substrate 2 is cooled to temperatures below 150° C. or below 100° C. by dissipation of heat into the inert gas.

All disclosed features are (individually but also in combination with each other) essential to the invention. The contents of disclosure of the associated/accompanying priority documents (copy and previous application) are herewith also incorporated in the disclosure of the application in their entirety, also for the purpose of including the features of said documents in claims of the present application. With their features, the subordinate claims characterize stand-alone inventive advances of the related art even without the features of a referenced claim, in particular with a view to submitting divisional applications on the basis of said claims. The invention defined in each claim may also include one or more of the features specified in the preceding description, in particular such that are denoted with reference numerals and/or are referenced in the list of reference numerals. The invention also relates to design variants in which individual features defined in the preceding description have not been realised, particularly if they are evidently not essential in order to fulfil the respective intended purpose or if they can be replaced with other technically equivalent means.

LIST OF REFERENCE NUMERALS

1 Housing
2 Endless substrate
3 First peripheral zone
4 Second peripheral zone
5 Central zone
6 First opening
7 Second opening
8 Gas inlet
9 Heating device
10 Pump
11 Gas distribution volume
12 Gas extraction volume
13 Gas outlet opening
14 Gas inlet opening
15 Control device
16 Gas outlet
17 Flushing chamber
18 First roll
19 Second roll
20 Gas outlet opening
21 Heating device
22 Reactive gas supply line
24 Extraction opening
F Conveying direction

What is claimed is:

1. A method for depositing carbon-containing structures on a substrate (2) conveyed through an interior of a housing (1), wherein the housing interior has a first peripheral zone (3) adjacent to a first opening (6) of the housing (1), a second peripheral zone (4) adjacent to a second opening (7) of the housing (1), and a central zone (5) arranged between the first and second peripheral zones (3, 4), the method comprising:
    inserting the substrate (2) into the housing (1) through the first housing opening (6);
    passing the substrate (2) through the central zone (5) in a conveying direction (F) from the first housing opening (6) to the second housing opening (7);
    removing the substrate (2) from the housing (1) through the second housing opening (7);
    feeding a carbon-containing process gas into the housing interior through a gas outlet opening (20) of a gas inlet (8);
    heating the central zone (5) with a first heating device (21);
    evacuating the carbon-containing process gas from the housing interior through an extraction opening (24) of a gas outlet (16), wherein the extraction opening (24) is connected to a pump (10); and
    feeding a reactive gas into the first peripheral zone (3) through the first housing opening (6) or a reactive gas inlet opening (23) in a controlled manner, wherein the reactive gas is different from the carbon-containing process gas and chemically reacts in a first chemical reaction with contaminants on the substrate (2) and in a second chemical reaction with the carbon-containing process gas, wherein the gas outlet opening (20) and the extraction opening (24) are arranged and operated in the housing interior in such manner that a partial pressure of the reactive gas continuously decreases in the conveying direction (F) from the first housing opening (6) to the second housing opening (7) so that at least 90% of the first chemical reaction of the reactive gas with the contaminants on the substrate (2) and at least 90% of the second chemical reaction of the reactive gas with the carbon-containing process gas take place in the first peripheral zone (3).

2. The method of claim 1, further comprising feeding the reactive gas into the second peripheral zone (4) in controlled manner, wherein a first mass flow of the reactive gas entering the first peripheral zone (3) is greater than a second mass flow of the reactive gas entering the second peripheral zone (4).

3. The method of claim 1, further comprising:
    flushing a diffusion barrier (11, 12, 13, 14) with an inert gas, wherein the first housing opening (6) is formed by the diffusion barrier (11, 12, 13, 14) through which the substrate (2) is conveyed; and controlling a mass flow of the reactive gas entering through the first housing opening (6) by a construction of the diffusion barrier (11, 12, 13) or by controlling a mass flow of the inert gas used to flush the diffusion barrier (11, 12, 13), wherein the reactive gas comprises oxygen from ambient air.

4. The method of claim 3, wherein the diffusion barrier (11, 12, 13, 14) is controlled by at least one of: altering the inert gas mass flow or a distance separating adjacent gas outlet openings (13) or adjacent gas inlet openings (14) of the diffusion barrier (11, 12, 13, 14).

5. The method of claim 1, wherein the reactive gas is fed into the first peripheral zone (3) through the reactive gas inlet opening (23).

6. The method of claim 1, wherein for an overall length of the housing (1) defined by a distance between the first housing opening (6) and the second housing opening (7), at least one of: a length of the first peripheral zone (3) is equal to 20-30% of the overall length, or a length of the second peripheral zone (4) is equal to 15-25% of the overall length.

7. The method of claim 1,
wherein the substrate (2) is heated to a temperature between 500° C. and 1,200° C. for depositing graphene multilayer structures,
wherein the substrate (2) is heated to a temperature between 500° C. and 1,200° C. for depositing graphene monolayers, or
wherein the substrate (2) is heated to a temperature between 500° C. and 1,000° C. for depositing carbon nanotubes (CNT).

8. The method of claim 1, wherein at least one of: the partial pressure of the reactive gas in a region of the first housing opening (6) is less than or equal to 0.1% of a total pressure in the housing interior, or
the partial pressure of the reactive gas at a boundary between the first peripheral zone (3) and the central zone (5) is lower than 0.005% of the total pressure in the housing interior.

9. The method of claim 1, wherein the carbon-containing process gas includes a carbon-containing gas and an inert gas, and wherein a mass ratio of the carbon-containing gas to the inert gas is between 0.25 and 2.

* * * * *